(12) United States Patent
Tishbi

(10) Patent No.: US 11,513,887 B1
(45) Date of Patent: Nov. 29, 2022

(54) CANCELATION OF CROSS-COUPLING INTERFERENCE AMONG MEMORY CELLS

(71) Applicant: Apple Inc., Cupertino, CA (US)

(72) Inventor: Nir Tishbi, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/408,520

(22) Filed: Aug. 23, 2021

(51) Int. Cl.
G06F 11/30 (2006.01)
G06F 11/07 (2006.01)
G11C 8/06 (2006.01)
G11C 7/10 (2006.01)
G06F 11/10 (2006.01)

(52) U.S. Cl.
CPC ........ G06F 11/0793 (2013.01); G06F 11/079 (2013.01); G06F 11/0727 (2013.01); G06F 11/0751 (2013.01); G06F 11/1068 (2013.01); G11C 7/1051 (2013.01); G11C 8/06 (2013.01)

(58) Field of Classification Search
None
See application file for complete search history.

(56) References Cited

U.S. PATENT DOCUMENTS

| | | | |
|---|---|---|---|
| 3,060,806 A1 | 11/2011 | Shalvi et al. | |
| 8,050,086 B2 * | 11/2011 | Shalvi | G11C 16/26 365/185.02 |
| 8,156,398 B2 | 4/2012 | Sommer | |
| 8,156,403 B2 * | 4/2012 | Shalvi | G06F 11/1072 714/764 |
| 8,209,588 B2 | 6/2012 | Perlmutter et al. | |
| 8,374,026 B2 | 2/2013 | Sharon et al. | |
| 8,508,989 B2 | 8/2013 | Alrod et al. | |
| 8,650,352 B2 | 2/2014 | Weingarten | |
| 9,086,993 B2 | 7/2015 | Sokolov et al. | |
| 9,229,804 B2 | 1/2016 | Birk et al. | |
| 2009/0158126 A1 * | 6/2009 | Perlmutter | G11C 27/005 714/E11.034 |
| 2009/0199074 A1 * | 8/2009 | Sommer | G11C 29/42 714/763 |
| 2014/0331106 A1 * | 11/2014 | Baum | G11C 29/028 714/766 |
| 2014/0344519 A1 * | 11/2014 | Gurgi | G06F 12/0246 711/118 |

* cited by examiner

Primary Examiner — Mujtaba M Chaudry
(74) Attorney, Agent, or Firm — Kligler & Associates Patent Attorneys Ltd

(57) ABSTRACT

A memory controller includes an interface and a processor. The interface communicates with memory cells that store data in predefined Programming Voltages (PVs). The processor is configured to produce observation samples that each includes (i) a target sample read from a target memory cell in a target Word Line (WL), and (ii) neighbor samples read from neighbor memory cells. Based on the observation samples, the processor is further configured to jointly estimate Cross-Coupling Coefficients (CCFs), by searching for CCFs that aim to minimize a predefined function of distances calculated between transformed observation samples that have been transformed using the CCFs and combinations of PVs that are closest to the respective transformed observation samples, to apply, based on the CCFs, cross-coupling cancelation to readout samples retrieved from the memory cells to produce enhanced readout samples, and to perform a storage operation related to reading data, using the enhanced readout samples.

24 Claims, 5 Drawing Sheets

US 11,513,887 B1

CANCELATION OF CROSS-COUPLING INTERFERENCE AMONG MEMORY CELLS

TECHNICAL FIELD

Embodiments described herein relate generally to data storage, and particularly to methods and systems for canceling cross-coupling interference among memory cells.

BACKGROUND

In various nonvolatile memories, the storage values held in memory cells may be distorted by cross-coupling interference from other memory cells. Various techniques for reducing cross-coupling effects are known in the art. For example, U.S. Pat. No. 9,229,804 describes a method of operating a nonvolatile memory (NVM) array that includes multiple NVM cells, the method includes: receiving input data to be written to the nonvolatile memory; performing constraint coding on the input data to provide encoded data; wherein the constraint coding prevents the encoded data from including forbidden combinations of values; wherein the forbidden combinations of values are defined based on expected inter-cell coupling induced errors resulting from coupling between NVM cells; and writing the encoded data to the nonvolatile memory.

U.S. Pat. No. 8,209,588 describes a method that includes storing data in a group of analog memory cells by writing first storage values to the cells. After storing the data, second storage values are read from the cells using one or more first read thresholds. Third storage values that potentially cause cross-coupling interference in the second storage values are identified, and the third storage values are processed, to identify a subset of the second storage values as severely-interfered values. Fourth storage values are selectively re-read from the cells holding the severely-interfered values using one or more second read thresholds, different from the first read thresholds. The cross-coupling interference in the severely-interfered storage values is canceled using the re-read fourth storage values. The second storage values, including the severely-interfered values in which the cross-coupling interference has been canceled, are processed so as to reconstruct the data stored in the cell group.

SUMMARY

A memory controller includes an interface and a processor. The interface is configured to communicate with a plurality of memory cells, an individual one of the plurality of memory cells is configured to store data in one of multiple predefined nominal Programming Voltages (PVs). The processor is configured to produce multiple observation samples, an individual observation sample includes (i) a target sample read from a target memory cell in a target Word Line (WL), and (ii) multiple neighbor samples read from multiple respective neighbor memory cells in multiple neighbor WLs. Based on the observation samples, the processor is further configured to jointly estimate Cross-Coupling Coefficients (CCFs) that model cross-coupling interference caused to target memory cells in the target WL by neighbor memory cells in the neighbor WLs, by searching for CCFs that aim to minimize a sum of square distances calculated between transformed observation samples that have been transformed using the CCFs and respective combinations of nominal PVs that are together closest in distance to the respective transformed observation samples, to apply, based on the estimated CCFs, cross-coupling cancelation to one or more readout samples retrieved from the plurality of memory cells to produce respective enhanced readout samples, and to perform a storage operation related to reading data from the plurality of memory cells using the enhanced readout samples.

In some embodiments, the processor is configured to jointly estimate CCFs $\alpha$ and $\beta$ corresponding to cross-coupling interference caused by neighbor memory cells in respective first and second neighbor WLs adjacent to the target WL. In other embodiments, the processor is configured to calculate a transformed observation sample by multiplying a corresponding observation sample by an inverse matrix of a coupling matrix $\overline{H}$ that contains $\alpha$ along a first diagonal and $\beta$ along a second different diagonal. In yet other embodiments, the processor is configured to calculate a transformed observation sample by multiplying a corresponding observation sample by a coupling vector $\underline{h}^T$ that is given by $\underline{h}=[-\beta\ 1\ -\alpha]^T$.

In an embodiment, the processor is configured to identify a nominal PV among the predefined nominal PVs that is closest in distance to a given transformed observation sample using a slicing operation. In another embodiment, the processor is configured to apply cross-coupling cancelation to a given observation sample, by multiplying the given observation sample by a coupling matrix containing one or more columns of a coupling matrix that contains a first estimated CCF along a first diagonal and a second estimated CCF along a second different diagonal. In yet another embodiment, the processor is configured to apply cross-coupling cancelation to a given observation sample, by multiplying the given observation sample by a vector given by: $[-\hat{\beta}\ 1\ -\hat{\alpha}]$, $\hat{\alpha}$ and $\hat{\beta}$ include previously estimated CCFs.

In some embodiments, the processor is configured to apply cross-coupling cancellation to a first observation sample independently from a second observation sample, both the first observation sample and the second observation sample contain first and second target samples produced respectively from first and second target memory cells in the target WL. In other embodiments, the processor is configured to use CCFs estimated based on first observation samples, for cancelling cross-coupling interference in second observation samples different from the first observation samples. In yet other embodiments, the enhanced readout samples correspond to a group of multiple target memory cells in a selected target WL that store a code word encoded using an Error Correction Code (ECC), and the processor is configured to apply the storage operation by calculating one or more soft metrics based on the enhances readout samples, and to decode the ECC of the code word using a soft decoding scheme based on the soft metrics.

In an embodiment, the processor is configured to read the target memory cells at a first voltage resolution to produce the target samples, and to read the neighbor memory cells at a second voltage resolution to produce the neighbor samples, the first voltage resolution is higher than the second voltage resolution.

There is additionally provided, in accordance with an embodiment that is described herein, a method for data storage, including, in a memory controller that communicates with a plurality of memory cells, an individual one of the plurality of memory cells is configured to store data in one of multiple predefined nominal Programming Voltages (PVs), producing multiple observation samples, an individual observation sample includes (i) a target sample read from a target memory cell in a target Word Line (WL), and (ii) multiple neighbor samples read from multiple respective neighbor memory cells in multiple neighbor WLs. Based on the observation samples, Cross-Coupling Coefficients (CCFs) that model cross-coupling interference caused to target memory cells in the target WL by the neighbor memory cells in the neighbor WLs are jointly estimated, by searching for CCFs that aim to minimize a sum of square distances calculated between transformed observation samples that have been transformed using the CCFs and respective combinations of nominal PVs that are together closest in distance to the respective transformed observation samples. Based on the estimated CCFs, cross-coupling cancelation is applied to one or more readout samples retrieved from the plurality of memory cells to produce respective enhanced readout samples. A storage operation related to reading data from the plurality of memory cells is performed using the enhanced readout samples.

These and other embodiments will be more fully understood from the following detailed description of the embodiments thereof, taken together with the drawings in which:

DETAILED DESCRIPTION OF EMBODIMENTS

Overview

Figure 1:
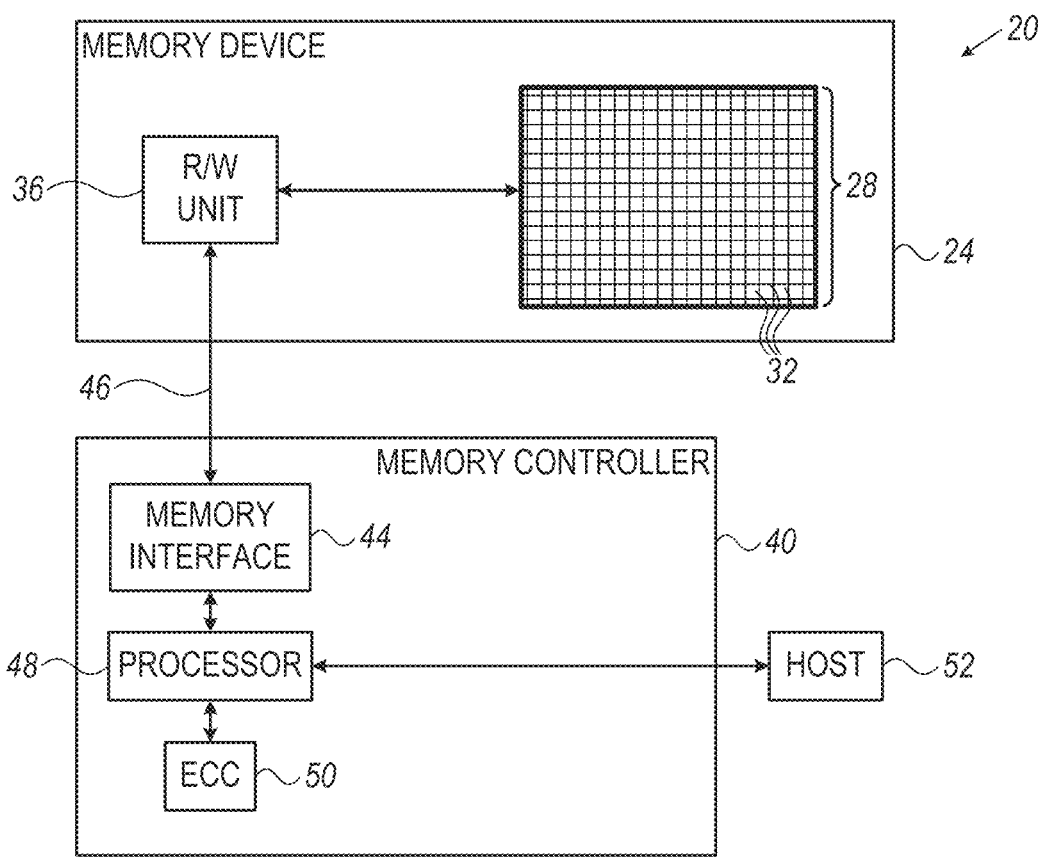
FIG. 1 is a block diagram that schematically illustrates a memory system, accordance with an embodiment that is described herein.

In many practical implementations of memory cell arrays, a memory cell may be subjected to interference originating from multiple nearby memory cells, which may or may not be adjacent to the interfered memory cell in the array. Interference caused by nearby memory cells is also referred to as "cross-coupling interference."

Embodiments that are described herein provide improved methods and systems for estimation and cancellation of cross-coupling interference. The methods and systems described herein make use of the fact that the CCI level in a memory cell can be modeled as a function of the storage values of the interfering memory cells and that of the interfered memory cell.

Cross-Coupling Interference (CCI) may result in shifting the storage value of a given memory cell depending on storage values in neighbor memory cells. Cross coupling interference may cause the storage value of a given memory cell to fall on the wrong side of a read threshold and may therefore cause read errors. High levels of CCI are expected, for example, in various types of memory devices, e.g., such as in Three-Dimensional (3D) configuration, in which the memory cells are organized in thin layers.

In principle, canceling CCI effects could be carried out within the memory device containing the memory cells. Some memory device vendors provide a CCI cancelation feature. Such features, however, are typically insufficient because they support removing only a small portion of the CCI, and usually do not support cancelation of CCI originating from multiple neighbor memory cells.

In the disclosed embodiments, CCI originating from multiple neighbor memory cells is modeled using cross-coupling coefficients. The cross-coupling coefficients are first estimated and then used for canceling (or significantly reducing) the CCI caused by neighbor memory cells. Modeling CCI using cross-coupling coefficients, is suitable, for example, in NAND Flash memories.

Consider an embodiment of a memory controller that includes an interface and a processor. The interface communicates with a plurality of memory cells, wherein an individual one of the plurality of memory cells is configured to store data in one of multiple predefined nominal Programming Voltages (PVs). The processor as configured to produce multiple observation samples, wherein an individual observation sample includes (i) a target sample read from a target memory cell in a target Word Line (WL), and (ii) multiple neighbor samples read from multiple respective neighbor memory cells in multiple neighbor WLs. Based on the observation samples, the processor jointly estimates one or more Cross-Coupling Coefficients (CCFs) that model cross-coupling interference caused to target memory cells in the target WL by neighbor memory cells in the neighbor WLs, by searching for CCFs that aim to minimize a predefined function of distances calculated between transformed observation samples that have been transformed using the CCFs and respective combinations of nominal PVs that are together closest in distance to the respective transformed observation samples. Based on the estimated CCFs, the processor applies cross-coupling cancelation to one or more readout samples retrieved from the plurality of memory cells to produce respective enhanced readout samples, and performs a storage operation related to reading data from the plurality of memory cells using the enhanced readout samples. In an example embodiment, the predefined function includes a sum of multiple distances squared. Alternatively, other suitable functions of the distances can also be used.

In some embodiments, the processor jointly estimates CCFs $\alpha$ and $\beta$ corresponding to cross-coupling interference caused by neighbor memory cells in respective first and second neighbor WLs adjacent to the target WL. The processor may estimate the CCFs in various ways. In one embodiment, the processor calculates a transformed observation sample by multiplying a corresponding observation sample by an inverse matrix of a coupling matrix $\overline{H}$ that contains $\alpha$ along a first diagonal and $\beta$ along a second different diagonal. In another embodiment, the processor calculates a transformed observation sample by multiplying a corresponding observation sample by a coupling vector $\underline{h}^T$ that is given by $\underline{h}=[-\beta\ 1-\alpha]^T$. For efficient calculation of the closest distance in this case, the processor identifies a nominal PV among the predefined nominal PVs that is closest in distance to a given transformed observation sample using a slicing operation.

As noted above, the processor applies CCI cancelation using the estimated CCFs. In one embodiment, the processor applies cross-coupling cancelation to a given observation sample, by multiplying the given observation sample by a coupling matrix that contains a first estimated CCF along a first diagonal and a second estimated CCF along a second different diagonal. In another embodiment, the processor applies cross-coupling cancelation to a given observation sample, by multiplying the given observation sample by a vector given by: $[-\hat{\beta} \; 1-\hat{\alpha}]$, wherein $\hat{\alpha}$ and $\hat{\beta}$ denote previously estimated CCFs.

In some embodiments, the processor applies CCI cancelation to a given observation sample independently from CCI applied to other observation samples that were produced based on target samples read from the same target WL. The processor may use CCFs estimated based on first observation samples for cancelling CCI in second observation samples different from the first observation samples.

In some embodiments, the enhanced readout samples correspond to a group of multiple target memory cells in a selected target WL that store a code word encoded using an Error Correction Code (ECC). In such embodiments, the processor may apply the storage operation by calculating one or more soft metrics based on the enhances readout samples, and decode the ECC of the code word using a soft decoding scheme based on the soft metrics.

The processor may sample the target memory cells and the neighbor memory cells at the same or different voltage resolutions. In an example embodiment, the processor reads the target memory cells at a first voltage resolution to produce the target samples, and reads the neighbor memory cells at a second voltage resolution to produce the neighbor samples, wherein the first voltage resolution is higher than the second voltage resolution.

In the disclosed techniques, cross-coupling coefficients are first estimated, and then used for canceling cross-coupling interference caused by multiple neighbor cells. The cross-coupling coefficients model the cross-coupling effect of neighbor memory cells on target memory cells, and may be estimated accurately, e.g., using various ML-based estimators. Practical low-complexity embodiments that approximate an ML estimator for cross-coupling estimation and cancellation are also derived.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 includes a memory device 24, which stores data in a memory array 28 that includes multiple memory cells 32, such as analog memory cells. In the context of the present patent application, the term "analog memory cell" is used to describe any memory cell that holds a continuous, analog value of a physical parameter, such as an electrical voltage or charge. Memory array 28 may include solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value, also referred to as a nominal Programming Voltage (PV). For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), and a 4 bit/cell PLC, also referred to as a Quad-Level Cell (QLC) device can be respectively programmed to assume one of eight possible programming levels and one of sixteen programming levels. A memory cell that stores a single bit (i.e., using two programming levels) is also referred to as a Single-Level Cell (SLC).

Memory device 24 includes a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. The R/W module can also read the storage values of the memory cells in selected ranges or zones by setting the read thresholds to zone boundaries.

The storage and retrieval of data in and out of memory device 24 is performed by a memory controller 40. Memory controller 40 includes a memory interface 44 for communicating with memory device 24, a processor 48, and an Error Correction Code (ECC) module 50. The memory controller communicates with the memory device via memory interface 44 over a communication link 46. Communication link 46 may include any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the FCC of data retrieved from the memory. ECC module 50 may include any suitable type of ECC, such as, for example, Low Density Parity Check (LDPC), Reed-Solomon (RS) or Bose-Chaudhuri- Hocquenghem (BCH), can be used. It should be noted, however, that embodiments that are described below that rely on calculating a syndrome weight refer mainly to codes that can be represented by a set of parity-check equations such as, for example, LDPC codes. Moreover, a good approximation of the number of errors from the syndrome weight is achieved for codes having a sparse parity-check matrix, such as, for example, LDPC codes.

Data read from a group of memory cells may contain one or more errors. The number of errors typically increases when the read threshold used for sensing the memory cells is positioned non-optimally. In some applications, the ECC supported by ECC module 50 can be represented by multiple parity-check equations.

Memory controller 40 may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a Redundant Array of Independent Disks (RAID) storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may res de on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller 40 includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell includes a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "colon" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subgroup of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may include thousands of erasure blocks (also referred to as "memory blocks"). In a typical two-dimensional (2D) two-bit-per-cell MLC device, each erasure block is on the order of 128 word lines, each including several tens of thousands of memory cells. Two-bit-per-cell devices having 128 word lines per erasure block that store a data page per bit significance value would have 256 data pages per erasure block, and three-hit-per-cell devices would have 394 data pages per block. A typical three-dimensional (3D) device that stores three bits per cell may include, for example, 4 sections per block, wherein each section includes several thousand strings that each includes 48 layers of cell columns. Such a 3D device has 12 data pages per a physical word line, or 576 data pages per an erasure block. Alternatively, other block sizes and configurations can also be used.

Models of Cross-Coupling Interference

The values (e.g., threshold voltages) stored in memory cells 32 may be subjected to cross-coupling interference, in which nearby memory cells in the memory array may modify the threshold voltage of a particular memory cell. The effect of interfering neighbor memory cells on a given memory cells also referred to as Cross-Coupling Interference (CCI).

CCI caused to memory cells 32 degrades the performance of the memory device, e.g., the error probability when reconstructing the data, the achievable storage capacity and/or the achievable data retention period. Performance degradation is particularly severe in memory devices in which the memory cells reside physically close to one another, and in memory devices having a large number of programming states with relatively small inter-state voltage differences.

In many practical cases, a certain interfered cell is subject to interference caused by multiple interfering cells. The interfering memory cells may or may not be adjacent to the interfered memory cell in the memory array. For example, CCI usually occurs between nearby cells, although not necessarily directly adjacent to one another.

In general, it is possible to model the composite CCI in a certain interfered memory cell depending on the storage values of the (one or more) interfering memory cells and the interfered cell.

It should be noted that memory cells in different WLs of a common erasure block may be subjected to respective levels of CCI that may significantly differ from one another.

Figure 2:
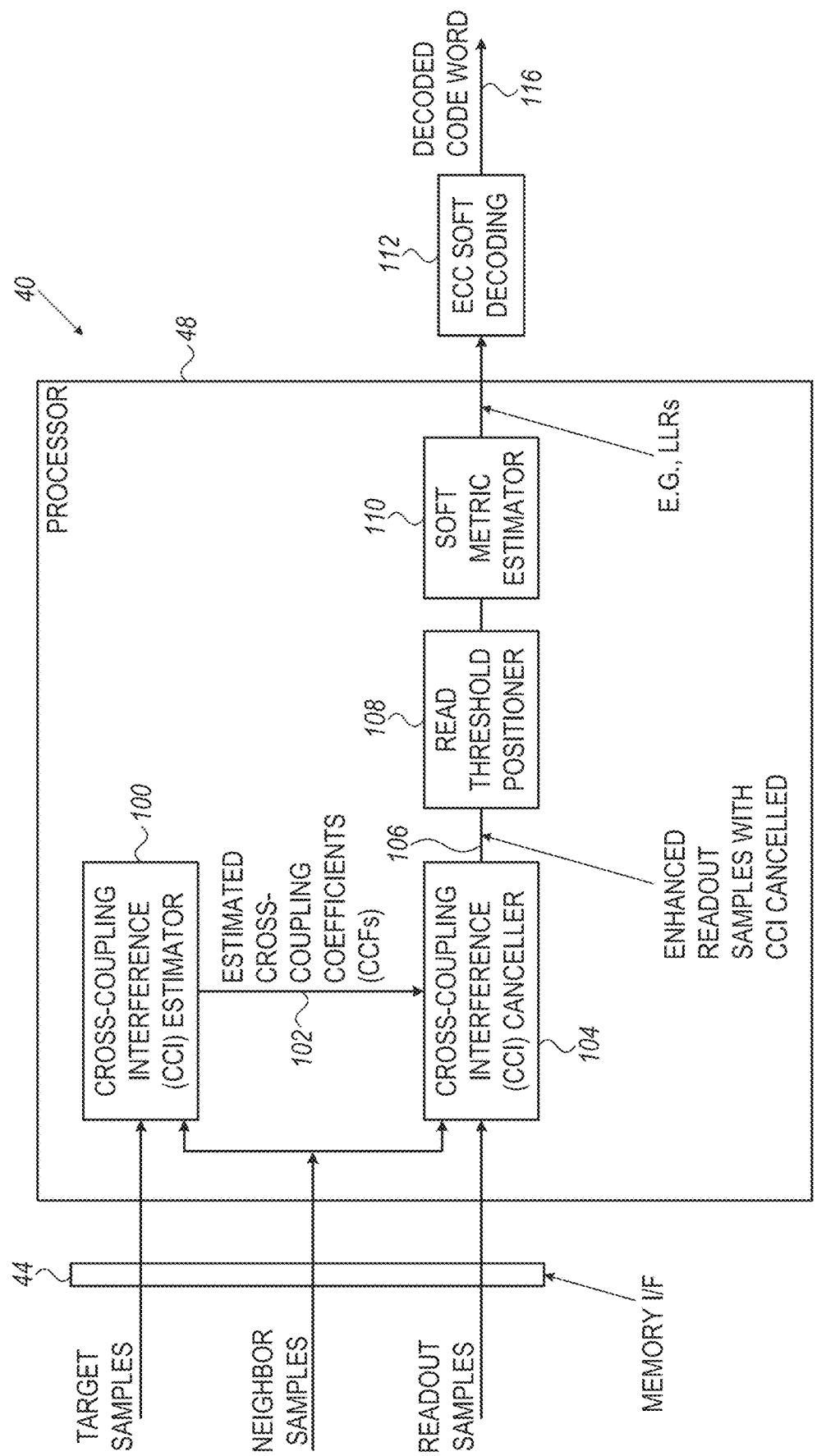
FIG. 2 is a block diagram that schematically illustrates processing elements involved in estimation and cancelation of cross-coupling interference, in accordance with an embodiment that is described herein.

FIG. 2 is a block diagram that schematically illustrates processing elements involved in estimation and cancelation of cross-coupling interference, in accordance with an embodiment that is described herein.

The various processing elements in FIG. 2 may be implemented, for example, by processor 48 of memory controller 40 of FIG. 1.

In FIG. 2, a CCI estimator 100 receives, via memory interface 44, target samples read from a group of target memory cells belonging to a target WL, and neighbor samples read from neighbor memory cells belonging to one or more neighbor WLs. Based on both the target samples and the neighbor samples, CCI estimator 100 estimates CCFs 102 that model CCI caused to target memory cells by neighbor memory cells.

A CCI canceller 104 receives via memory interface 44 readout samples read from memory cells in the target WL, and neighbor samples read from the neighbor memory is belonging to the one or more neighbor WLs. The readout samples are typically subjected to CCI caused by interfering memory cells. The readout samples are read using multiple read thresholds positioned at a middle range of the threshold voltage axis between two adjacent programming levels. The CCI canceler further receives CCFs 102 that were estimated by CCI estimator 100. The readout samples may be read from the same or different target memory cells (and accordingly same or different neighbor memory cells) used for estimating the CCFs. Based on the readout samples, neighbor samples and the CCFs, CCI canceler 104 produces from the readout samples respective enhanced readout samples 106 in which CCI is cancelled (at least partially).

The enhanced readout samples may be used in various storage operations. In the example of FIG. 2, a read threshold positioner 108 determines, based on enhanced readout samples 106, accurate positioning of one or more read thresholds that result in a minimal (or close to minimal) bit error rate in reading the memory cells.

Further in the example of FIG. 2, a soft metric estimator 110 estimates, based on the accurately positioned read thresholds, any suitable type of soft metrics such as, for example Log-Likelihood. Ratios (LLRs). An EEC soft decoder 112 applies a soft decoding scheme to the enhanced readout samples, using the estimated soft metrics, to produce a decoded CW 116. In FIG. 2 the soft FCC decoder is implemented externally to processor 48, e.g., using ECC module 50 of FIG. 1. Alternatively, ECC soft decoder 112 may be implemented by processor 48. It should be noted that under severe conditions, successful decoding may not be possible without the CCI cancelation of CCI canceller 104. Due to the CCI cancelation, the number of errors in the enhanced readout samples is typically much smaller than could be achieved without CCI cancelation, which results in improved readout performance.

Although in the example of FIG. 2, positioning read threshold by read threshold positioning 108 is part of an overall decoding process of a CW read from memory, read-threshold positioner 108 may also be used to determine accurate read thresholds to be used in subsequent read operations.

The processing scheme in FIG. 2 is robust in a sense that it works on raw samples directly and does not require any calibrations and/or pre-processing to successfully eliminate the CCI. Consequently, the CCI estimation and CCI cancelation phases may be used as initial post-processing applied to data retrieved from the memory cells, before being subjected to other processing. The resulting enhanced readout samples can then be used in subsequent processing phases (e.g., estimation of soft metrics and ECC decoding) while ignoring the implications of CCI.

The disclosed embodiments thus separate between CCI estimation and cancellation, and other processing that may be applied to the readout samples. This architecture is different from conventional architectures in which the readout samples to be processed are distorted by CCI, which often requires special handling, and/or results in performance degradation.

Now is described in detail the process of producing target samples and neighbor samples. In some embodiments, in reading the target samples, processor 48 reads target memory cells using multiple target read thresholds that are distributed (e.g., uniformly) along the threshold voltage axis. A common target sample value is assigned to target memory cells whose threshold voltages fall between adjacent target read thresholds. Similarly, in reading the neighbor samples, the processor reads neighbor memory cells in a neighbor WL using multiple neighbor read thresholds that are distributed (e.g., uniformly) along the threshold voltage axis. A common neighbor sample value is assigned to neighbor memory cells in the neighbor WLs whose threshold voltages fall between adjacent neighbor read thresholds.

Sampling the target memory cells and the neighbor memory cells at a high resolution provides target samples and neighbor samples that are close to the actual threshold voltages of the relevant memory cells. In some embodiments, the neighbor cells may be sampled at a relatively low resolution with little accuracy loss in estimating the CCFs. In such embodiments, the processor reads the target memory cells at a first voltage resolution to produce the target samples, and further reads the neighbor memory cells at a second voltage resolution to produce the neighbor samples, wherein the first voltage resolution is higher than the second voltage resolution.

The readout configuration depicted in FIG. 2 is given by way of example and other suitable readout configurations can also be used. The various processing elements in FIG. 2 may be implemented, for example, by processor 48 of memory controller 40 of FIG. 1. Alternatively, some or all of the processing elements in FIG. 2 may be implemented in hardware or in combination of hardware and software.

Methods For Estimation of Cross-Coupling Coefficients

Some of the disclosed embodiments are based on modeling the CCI as a function of the storage values of target memory cells and of neighbor memory cells causing the interference. In some embodiments, such a function may include a linear function of these storage values using CCFs as multiplicative factors.

Some of the embodiments that will be described below are developed using a Maximum Likelihood (ML) estimation approach. Using various approximations, low-complexity robust ML-based estimators are derived, that are feasible to be implemented in practical memory systems such as memory system 20. The methods for CCFs estimation may performed by processor 48 of memory controller 40.

Based on measurements carried out over memory devices of various vendors and production generations, CCI may be specified using a linear model given by:

$$\underline{y} = H(\underline{s} + \underline{w}) \quad \text{Equation 1:}$$

In Equation 1, $\underline{y} = [y_{-1} y_0 y_1]^T$ denotes a 3-by-1 observation sample (T denotes a transpose operation), $\underline{s} = [s_{-2} s_{-1} s_0 s_1 s_2]^T$ denotes 5-by-1 vector of nominal Programming Voltages (PVs), $\underline{w}$ denotes a 5-by-1 noise vector, and H denotes a 3-by-5 coupling matrix that depends on CCFs denoted $\alpha$ and $\beta$, as given by:

$$H = \begin{bmatrix} \beta & 1 & \alpha & 0 & 0 \\ 0 & \beta & 1 & \alpha & 0 \\ 0 & 0 & \beta & 1 & \alpha \end{bmatrix} \quad \text{Equation 2}$$

In Equation 1, indices of elements in $\underline{y}$ and $\underline{s}$ denote indices of relevant WLs. Specifically, an index 0 denotes an index of a target WL, negative indices (−1 and −2) denote indices of neighbor WLs upper to the target WL, and positive indices (1 and 2) denote indices of neighbor WLs lower to the target WL. For example, $y_0$ denotes an observation sample read from a target memory cell in a target WL, and $s_0$ denotes the nominal PV to which that target cell has been programmed. The observation samples $y_{-1}$ and $y_1$ denote samples read from neighbor memory cells in respective neighbor WLs, e.g., upper and lower neighbor ls adjacent to the target WL.

The element $S_j$ in the vector $\underline{s}$ includes a discrete random variable that is distributed uniformly over the finite set (denoted $\mathbb{S}$) of nominal PVs.

In Equation 1, the noise vector $\underline{w}$ includes a programming noise, modeled as a white Gaussian noise having a zero mean and $\sigma_w^2$ variance given by:

$$\underline{w} \sim N(\underline{0}, \sigma_w^2 I) \quad \text{Equation 3:}$$

Each element of programming nose vector $\underline{w}$ models the variance in the threshold voltages of memory cells that were programmed to a common PV.

Coupling matrix H in Equation 2 includes CCFs denoted $\alpha$ and $\beta$. For a given WL that includes a given memory cell, the $\alpha$ and $\beta$ CCFs model the CCI caused respectively to the given memory cell by neighbor memory cells in neighbor WLs such as adjacent WLs upper and lower to the given WL. For example, in an embodiment, in an erasure block whose WLs are indexed by indices k=0. . . K−1, the given memory cell may belong to WL(k), whereas two memory cells that cause CCI to the given memory cell belong respectively to adjacent WLs in the erasure block −WL(k−1) and WL(k+1).

Consider now multiple observation samples that each is modeled as given in Equation 1 above. Assuming a number N of observation samples, the $n^{th}$ observation sample is given by $$\underline{y}_n = H(\underline{s}_n + \underline{w}_n), \ 0 \leq n \leq N-1 \quad \text{Equation 4:}$$

Let an aggregated observation be given by:

$$\underline{Y\alpha} = \begin{bmatrix} \underline{y}_0^T & \cdots & \underline{y}_{N-1}^T \end{bmatrix}^T \quad \text{Equation 5}$$

Assuming that the observation samples are statistically independent, the Probability Density Function (PDF) of $\underline{Y\alpha}$ is given by:

$$f(\underline{Y\alpha}) = \prod_{n=0}^{N-1} f(\underline{y}_n) = \prod_{n=0}^{N-1}\left[\sum_{\underline{s}_n} f(\underline{y}_n/\underline{s}_n) P(\underline{s}_n)\right] \quad \text{Equation 6}$$

Using ML approach, the most probable CCFs are jointly estimated as given by:

$$(\hat{\alpha}_{ML}, \hat{\beta}_{ML}) = \operatorname*{argmax}_{\alpha,\beta}[f(\underline{Y\alpha})] = \operatorname*{argmax}_{\alpha,\beta}\{\log[f(\underline{Y\alpha})]\} \quad \text{Equation 7}$$

Estimating the CCFs using explicit expressions for the PDFs in Equation 7 may be computationally complex. Since, however, the CCFs have small values compared to unity expressions that include second and/or higher order terms of the CCFs may be omitted. Moreover, a reduced coupling matrix that includes three columns of the coupling matrix H can be used, as given by:

$$\bar{H} = \begin{bmatrix} 1 & \alpha & 0 \\ \beta & 1 & \alpha \\ 0 & \beta & 1 \end{bmatrix} \quad \text{Equation 8}$$

Based on the reductions above, an approximate ML solution may be derived as given by:

$$(\hat{\alpha}, \hat{\beta}) = \operatorname*{argmax}_{\alpha,\beta} \sum_{n=0}^{N-1} \log\left[\sum_{\underline{s}' \in \mathbb{S}} \exp\left(-\frac{G(\underline{y}_n, \underline{s}')}{2\sigma_w^2}\right)\right] \quad \text{Equation 9}$$

Wherein the outer sum runs over the observation samples, the inner sum runs over all three-element vectors $\underline{s}'$ whose elements belong to the set $\mathbb{S}$ of PVs, and $G(\underline{y}_n, \underline{s}')$ is given by:

$$G(\underline{y}_n, \underline{s}') = \|\bar{H}^{-1}\underline{y}_n - \underline{s}'\|^2 \quad \text{Equation 10}$$

The operator $\|(\cdot)\|^2$ in Equation 10 (and in other Equations below) denotes a square-norm operator for calculating a Euclidean distance. Alternatively, other operators that calculate other types of distances can also be used. In Equation 10 the norm operator calculates the Euclidean distance between $\bar{H}^{-1}\underline{y}_n$ and $\underline{s}'$. Using the max-log approximation, an approximated ML estimator may be derived from Equations 9 and 10 as given by:

$$(\hat{\alpha}, \hat{\beta}) = \operatorname*{argmin}_{\alpha,\beta} \sum_{n=0}^{N-1} \min_{\underline{s}' \in \mathbb{S}} \|\bar{H}^{-1}\underline{y}_n - \underline{s}'\|^2 \quad \text{Equation 11}$$

Equation 11 may be further simplified by (i) neglecting second order terms in $\bar{H}^{-1}$, and (ii) performing the inner minimization over $\underline{s}'$ based only on the target sample. The resulting low-complexity estimator of the CCFs is referred to herein as a Near-ML (NML) estimator, and is given by:

$$(\hat{\alpha}_{NML}, \hat{\beta}_{NML}) = \operatorname*{argmin}_{\alpha,\beta} \sum_{n=0}^{N-1} \min_{s' \in \mathbb{S}} (\underline{h}^T \underline{y}_n - s')^2 \quad \text{Equation 12}$$

wherein $\underline{h}$ in Equation 12 is given by:

$$\underline{h} = [-\beta \ 1 \ -\alpha]^T \quad \text{Equation 13:}$$

In some embodiments, each of Equations 11 and 12 may be calculated using a respective predefined function. that sums multiple distances squared. Alternatively, other suitable predefined functions may also be used, e.g., a function that sums multiple distances without squaring.

In some embodiments, for joint estimation of the CCFs, the expression in Equation 12 is evaluated for multiple candidate pairs of CCFs, and the candidate pair that minimizes the sum over the observation samples is selected as the preferable pair of CCFs. For a candidate pair $(\alpha,\beta)$, processor 48 calculates a transformed observation sample $\underline{h}^T \underline{y}_n$ for each observation $\underline{y}_n$, and the distance $(\underline{h}^T\underline{y}_n-s')^2$ in Equation 12 is minimized over all PVs s' in $\mathbb{S}$. In some embodiments, instead of searching over all PVs in $\mathbb{S}$, the processor identifies a nominal PV among the predefined nominal PVs in $\mathbb{S}$ that is closest in distance to a given transformed observation sample using a slicing operation that rounds $\underline{h}^T\underline{y}_n$ to value of the nearest PV.

Figure 3:
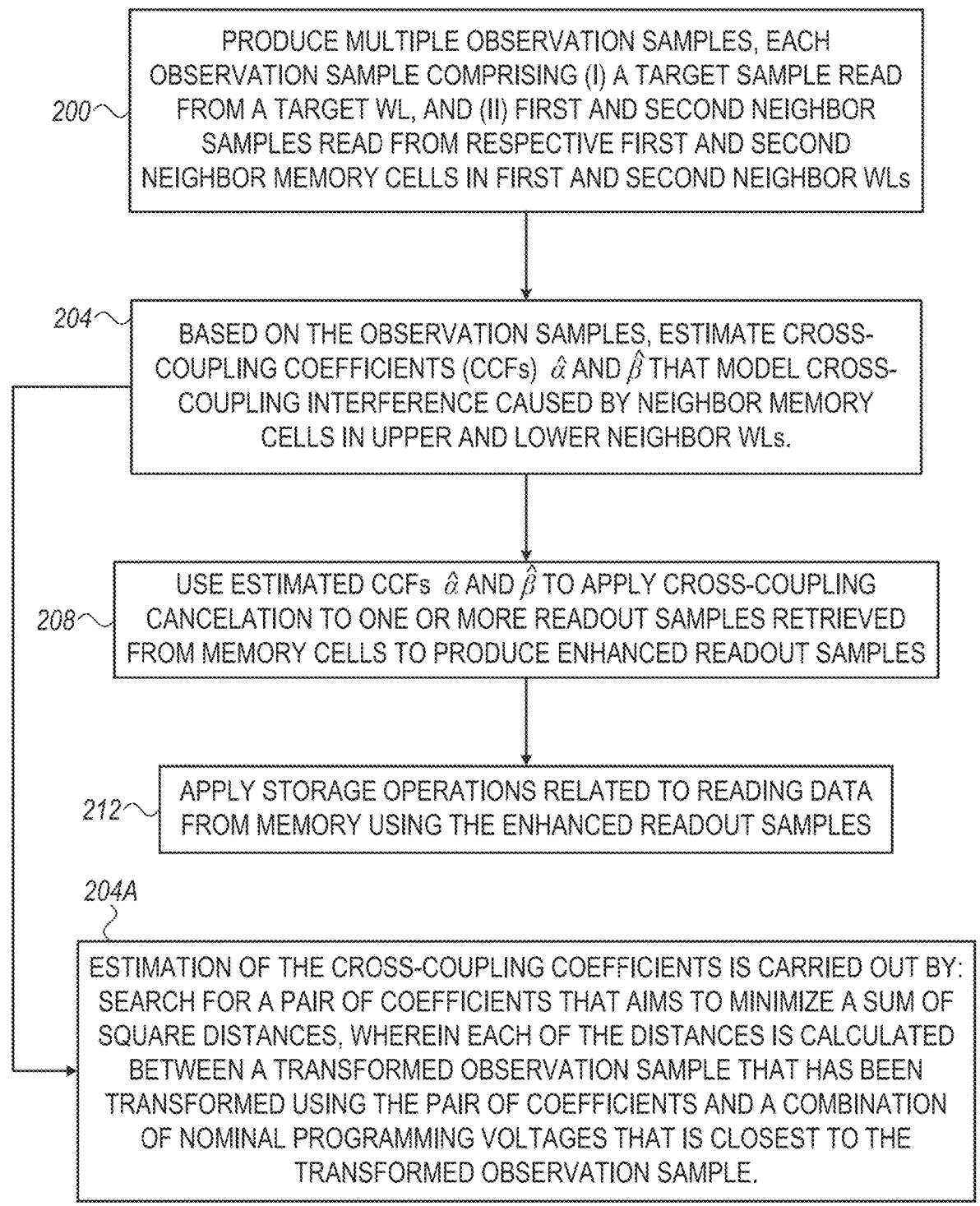
FIG. 3 is a flow chart that schematically illustrates a method for enhancing readout performance by cancelling cross-coupling interference using estimated cross-coupling coefficients, in accordance with an embodiment that is described herein.

FIG. 3 is a flow chart that schematically illustrates a method for enhancing readout performance by cancelling cross-coupling interference using estimated cross-coupling coefficients, in accordance with an embodiment that is described herein.

The method of FIG. 3 will be described as executed by memory controller 40 of FIG. 1, and in particular by processor 48 of the memory controller.

The method begins, at an observation-production stage 200, by processor 48 reading samples from selected memory cells 32 to produce a number N of observation samples. Specifically, the processor reads N target samples from respective N target memory cells in a target WL, and N neighbor samples from respective N neighbor memory cells in each of one or more neighbor WLs. For example, when the underlying model is based on two adjacent neighbor WLs, the target WI may have in index k −WL(k) and the two neighbor WLs may be indexed WL(k−1) and WL(k+1). Each observation sample $$\underline{y} = [y_{-1}\,y_0\,y_1]^T$$

contains a target sample $y_0$, a sample $y_{-1}$ of a neighbor memory cell in the upper adjacent word line WL(k+1) and a sample $y_1$ of a neighbor memory cell in the lower adjacent neighbor word line WL(k−1). In this notation the indices of observation samples along the WL have been omitted for clarity. The N observation samples produced at sage 200 are denoted $$\{\underline{y}_n\}_{n=0}^{N-1}.$$

At a coefficient estimation stage 204, processor 48 estimates, based on the N observation samples (or based on a selected partial subset of the N observation samples), CCFs denoted $\alpha$ and $\beta$ that model CCI caused to target memory cells in the target WL by neighbor memory cells in the neighbor WLs. Estimated values of these CCFs are denoted $\hat{\alpha}$ and $\hat{\beta}$, respectively. The processor may estimate the CCFs using any suitable method. For example, as described in a ML-based estimation stage 204A, the processor estimates the CCFs using a ML estimation approach. In one embodiment, in the ML-estimation approach, processor 48 searches for a pair of CCFs that aims to minimize a sum of square distances, wherein each of the distances is calculated between a transformed observation sample $$\bar{H}^{-1}\underline{y}_n$$

that has been transformed using a coupling matrix $\bar{H}$ (that depends on the CCFs) and a combination $\underline{s}'$ of nominal PVs that is closest in distance to the transformed observation sample. In an embodiment, a ML estimator of this sort is implemented based on the calculations in Equation 11 above. In alternative embodiments, a low-complexity approximate ML estimation of the CCFs is based on the calculations in Equation 12 above.

At a cross-coupling cancelation stage 208, processor 48 uses the CCFs estimated at stage 204, to apply cross-coupling cancelation to one or more readout samples retrieved from memory, so as to produce respective enhanced readout samples as will be described in detail below.

At a storage operation application stage 212, processor 48 applies one or more storage operations related to reading data from memory, using the enhanced readout samples. Example, storage operations may include calculating soft metrics for soft FCC decoding, and positioning of read thresholds, as described above with reference to FIG. 2. Following stage 212 the method terminates.

Methods for Canceling Cross-Coupling Interference

Next is derived an ML-based estimator for estimating enhanced observation samples in which CCI has been canceled. To this end, let $\underline{y}_m$ denote an observation sample that may be affected by CCI. The CCI is specified using a linear model as described for a sample $\underline{y}$ in Equation 1 above. Further let $\underline{v}_m$ denote an enhanced sample version of the observation sample $\underline{y}_m$ in which CCI has been cancelled (at least partially). The observation sample $\underline{y}_m$ contains a target sample read from a target memory cell in a target WL, and multiple neighbor samples (e.g., two neighbor samples) read from neighbor memory cells in respective neighbor WLs, similarly to the structure of the observation sample $\underline{y}_n$ described above. The observation sample $\underline{y}_m$, m=0 ... M−1, may belong to a group of M observation samples.

A ML estimator for $\underline{v}_m$ that is based on the observation samples and on the estimated CCFs, estimates the most probable $\underline{v}_m$, as given by:

$$\hat{\underline{v}}_m = \underset{\underline{v}_m}{\mathrm{argmax}}\, f(\underline{y}_m/\underline{v}_m) \qquad \text{Equation 14}$$

Let $\hat{H}$ denote the coupling matrix H of Equation 2 in which the CCFs include estimated coefficients $\hat{\alpha}$ and $\hat{\beta}$. An ML-based estimator for $\underline{v}_m$ is thus given by:

$$\hat{\underline{v}}_m = \underset{\underline{v}_m}{\mathrm{argmin}}\left[(\underline{y}_m - \hat{H}\underline{v}_m)^T (\hat{H}\hat{H}^T)^{-1} (\underline{y}_m - \hat{H}\underline{v}_m)\right] \qquad \text{Equation 15}$$

In a low-complexity implementation, the coupling matrix $\hat{H}$ in Equation 15 may be replaced with a reduced coupling matrix $$\hat{\bar{H}}$$

based on the reduced coupling matrix $\bar{H}$ of Equation 8.

The matrix $\hat{H}\hat{H}^T$ lift is a symmetric and positive-definite matrix and can therefore be factorized using the Cholesky factorization as $\hat{H}\hat{H}^T = AA^T$, wherein A includes a lower triangular and invertible matrix. Using this factorization, the ML-based estimator is given by:

$$\hat{\underline{v}}_m = \underset{\underline{v}_m}{\operatorname{argmin}} \| A^{-1}(\underline{v}_m - \hat{H}\underline{v}_m) \|^2 \quad \text{Equation 16}$$

The enhanced observation sample $\hat{\underline{v}}_m$ may be calculated explicitly by finding a $\underline{v}_m$ value that zeros the expression $\underline{v}_m - \hat{H}\underline{v}_m$ as given by:

$$\hat{\underline{v}}_{mML} = \hat{H}^T (\hat{H}\hat{H}^T)^{-1} \underline{v}_m \quad \text{Equation 17}$$

When the estimated CCFs $\hat{\alpha}$ and $\hat{\beta}$ are both small compared to unity, the expression in Equation 17 can be further simplified, as given by:

$$\hat{\underline{v}}_{mML} = [-\hat{\beta}_{NML} 1 - \hat{\alpha}_{NML}] \underline{v}_m \quad \text{Equation 18}$$

Figure 4:
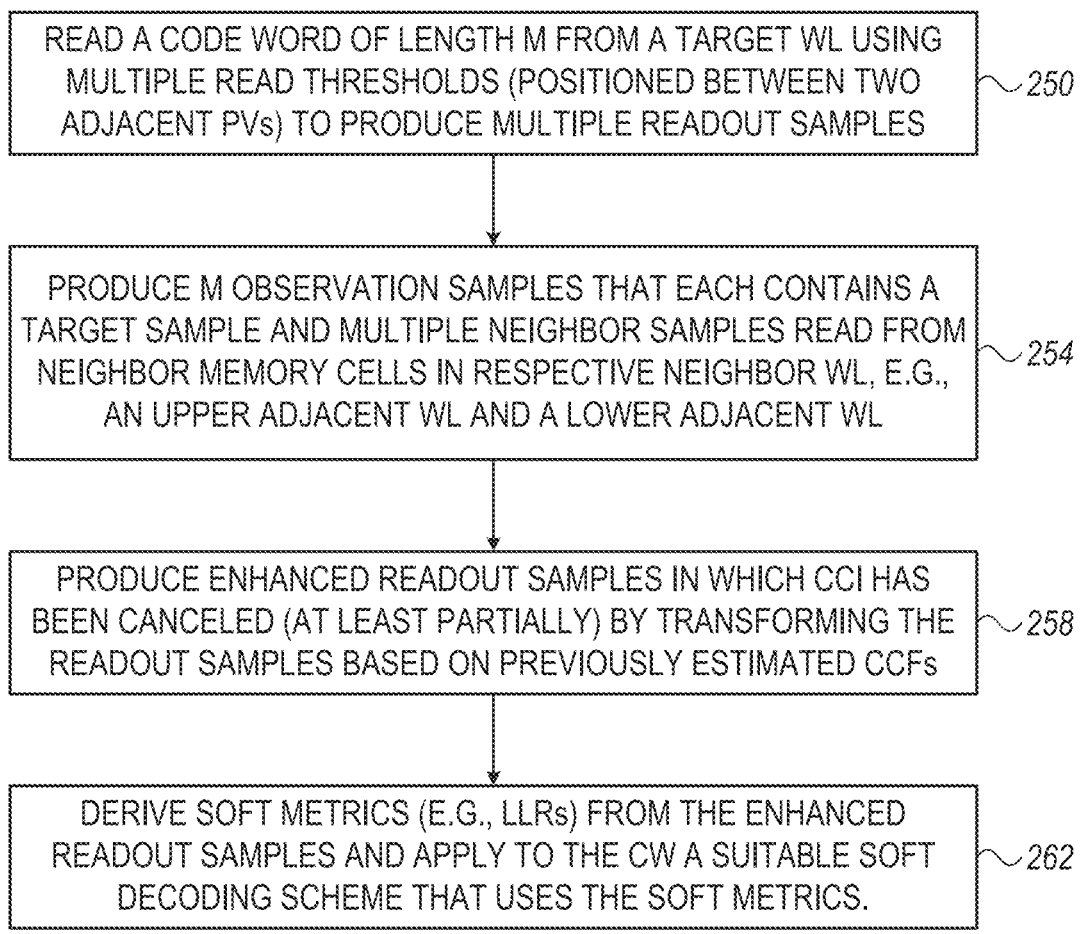
FIG. 4 is a flow chart that schematically illustrates a method for enhancing readout performance by canceling cross-coupling interference, in accordance with another embodiment that is described herein.

FIG. 4 is a flow chart that schematically illustrates a method for enhancing readout performance by canceling cross-coupling interference, in accordance with another embodiment that is described herein.

The method of FIG. 4 will be described as executed by memory controller 40 of FIG. 1, and in particular by processor 48 of the memory controller.

The method begins, at a CW reading stage 250, by processor 48 reading a CW of length M from a group of target memory cells in a target WL. The processor reads the target memory cells using multiple read thresholds (positioned between two adjacent PVs) to produce multiple respective readout samples.

At an observation production stage 254 the processor produces M observation samples that each contains a target sample and multiple neighbor samples (e.g., two neighbor samples) read from neighbor memory cells in respective neighbor WLs, e.g., an upper adjacent WL and a lower adjacent WL.

At an enhancement stage 258, processor 48 produces enhanced readout samples (of the readout samples of stage 250) in which CCI has been canceled (at least partially) by transforming the readout samples based on previously estimated CCFs. In one embodiment, the processor enhances the readout samples using the calculations in Equation 17. The coupling matrix in Equation 17 may include, for example, the 3-by-5 coupling matrix H of Equation 2 with the estimated CCFs. Alternatively, the reduced 3-by-3 coupling matrix $\bar{H}$ of Equation 8, with the estimated CCFs, can also be used. In another embodiment, the processor enhances the readout samples using the calculations in Equation 18.

At a soft decoding stage 262, processor 48 derives soft metrics from the enhanced readout samples of stage 258, and applies to the CW of stage 250 a suitable soft decoding scheme that uses the soft metrics. In alternative embodiments, the processor may use the enhanced readout samples for other reading-related operations, e.g., for accurate positioning of one or more read thresholds. Following stage 262 the method terminates.

Implementation Considerations and Performance Evaluation

The inventors have conducted various computer simulation tests for tuning various design parameters and to evaluate performance. The main simulation conditions are reported herein:

Estimation of CCFs is based on Equations 12 and 13 above.

Searching for the CCFs at a resolution of 0.002.

The overall sample size includes about 1 million code words.

Neighbor samples are represented using 3 bits.

Target samples for soft decoding are represented using 4 bits.

Page type tested in TLC—MSB page using 3 main read thresholds.

Page type tested in QLC—LSB page using 4 main read thresholds.

Working point is tuned to code words having about 550 errors after CCI cancelation, using continuous rather than quantized samples.

In one test, the inventors checked the increase in number of errors in a CW after CCI cancelation, due to sampling the neighbor memory cells at a several bit-resolution. The initial number of errors in the CW (e.g., as read from memory) is about 600.

Table 1 summarizes some results of that test, corresponding to neighbor samples of 3-bit per sample.

TABLE 1

Increase of number of errors in using 3-bit neighbor samples

| Memory type | Coeff. $\alpha$ | Coeff, $\beta$ | # Erros added |
|---|---|---|---|
| QLC | 0.02 | 0.01 | 3 |
| TLC | 0.04 | 0.03 | 6 |
| TLC | 0.05 | 0.04 | 10 |

As shown in Table 1, the increase in the number of errors with 3-bit neighbor samples is very small relative to the initial number of errors. The test also showed that using less than three bits per neighbor sample is typically insufficient and results in many errors.

Figure 5:
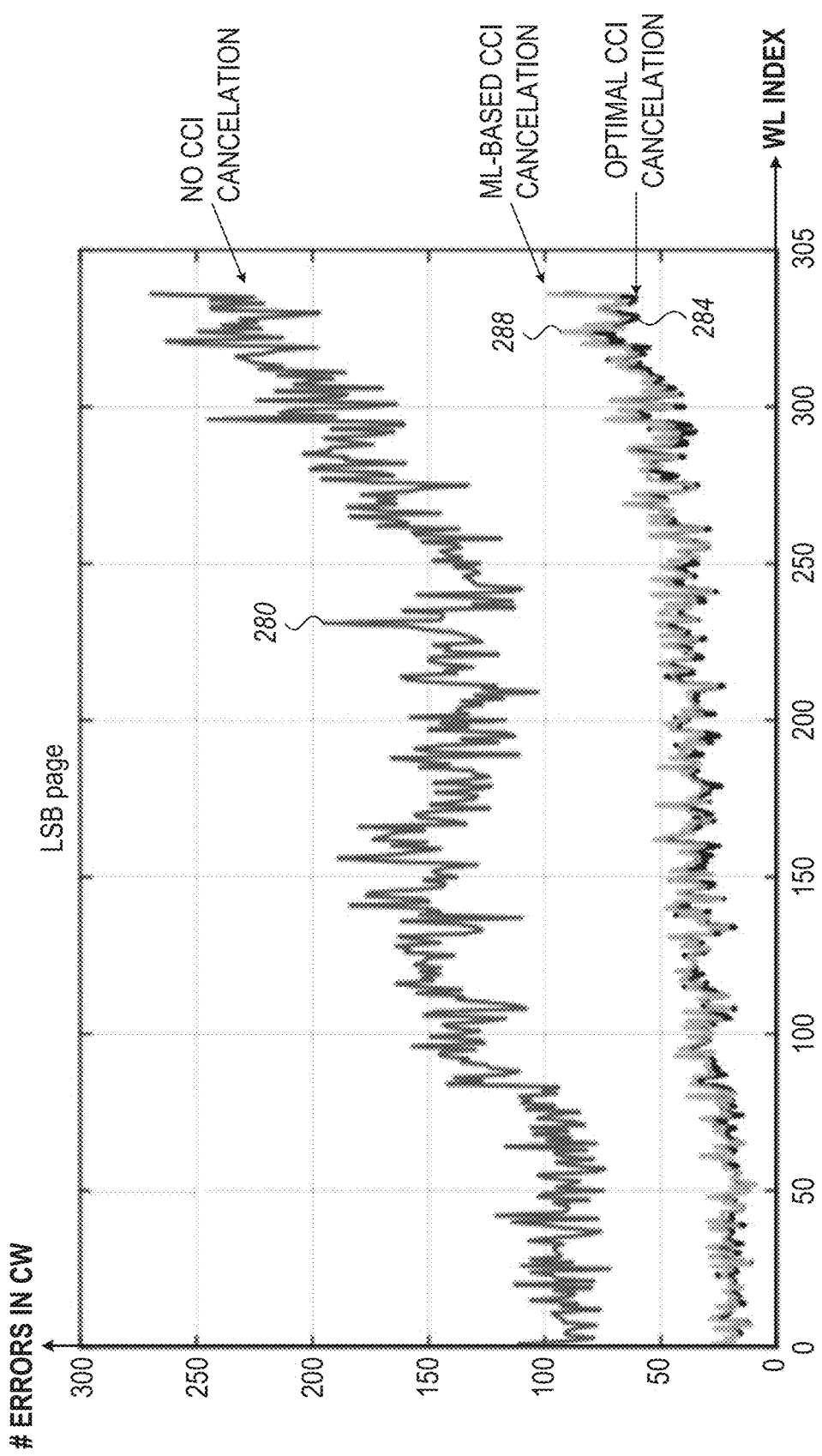
FIG. 5 is a diagram that schematically, illustrates readout performance in reading data from a memory array across multiple Word Lines (WLs), in accordance with an embodiment that is described herein.

FIG. 5 is a diagram that schematically illustrates readout performance in reading data from a memory array across multiple WLs of a memory block. In the example of FIG. 5, LSB pages are read from memory cells 32 in a TLC configuration. In the diagram, the horizontal axis denotes the WL index in a memory block, and the vertical axis denotes the average number of errors in the CWs retrieved from these WLs. The tests carried out to produce the graphs in FIG. 5 were performed by running computer simulations on data sampled from a physical NAND device.

The diagram includes a graph 280 corresponding to a reference test with no CCI cancelation, a graph 284 corresponding to a test with optimal CCI estimation and cancelation, and a graph 288 corresponding to a test with simplified. ML-based CCI estimation and cancellation. The term "optimal" here refers to using full ML estimation, without simplifications and approximations, as given e.g., in Equations 9 and 10 above. The ML-based simplified CCI estimation and cancellation methods were implemented using Equations 12 and 18 above.

As shown in the diagram, the readout performance using the ML-based CCI cancellation is very close to that of the optimal CCI cancellation. Moreover, the readout performance using the ML-based CCI cancellation as significantly better than the performance without using CCI cancellation.

The embodiments described above are given by way of example, and other suitable embodiments can also be used. For example, although the embodiments described above refer mainly to a CCI model that includes CCI from two neighbor memory cells, this is not mandatory. In alternative embodiments, a CCI model that is based on a number of interfering memory cells larger than two can be also used mutatis mutandis.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising:
    an interface configured to communicate with a plurality of memory cells, wherein an individual one of the plurality of memory cells is configured to store data in one of multiple predefined nominal Programming Voltages (PVs); and
    a processor configured to:
        produce multiple observation samples, wherein an individual observation sample comprises (i) a target sample read from a target memory cell in a target Word Line (WL), and (ii) multiple neighbor samples read from multiple respective neighbor memory cells in multiple neighbor WLs;
        based on the observation samples, jointly estimate Cross-Coupling Coefficients (CCFs) that model cross-coupling interference caused to target memory cells in the target WL by neighbor memory cells in the neighbor WLs, by searching for CCFs that aim to minimize a predefined function of distances calculated between transformed observation samples that have been transformed using the CCFs and respective combinations of nominal PVs that are together closest in distance to the respective transformed observation samples;
        based on the estimated CCFs, apply cross-coupling cancelation to one or more readout samples retrieved from the plurality of memory cells to produce respective enhanced readout samples; and
        perform a storage operation related to reading data from the plurality of memory cells using the enhanced readout samples.

2. The memory controller according to claim 1, wherein the predefined function comprises a sum of the distances squared.

3. The memory controller according to claim 1, wherein the processor is configured to jointly estimate CCFs $\alpha$ and $\beta$ corresponding to cross-coupling interference caused by neighbor memory cells in respective first and second neighbor WLs adjacent to the target WL.

4. The memory controller according to claim 3, wherein the processor is configured to calculate a transformed observation sample by multiplying a corresponding observation sample by an inverse matrix of a coupling matrix $\overline{H}$ that contains $\alpha$ along a first diagonal and $\beta$ along a second different diagonal.

5. The memory controller according to claim 3, wherein the processor is configured to calculate a transformed observation sample by multiplying a corresponding observation sample by a coupling vector $$\underline{h}^T$$

that is given by $$\underline{h} = [-\beta \ 1 \ -\alpha]^T.$$

6. The memory controller according to claim 5, wherein the processor is configured to identify a nominal PV among the predefined nominal PVs that is closest in distance to a given transformed observation sample using a slicing operation.

7. The memory controller according to claim 1, wherein the processor is configured to apply cross-coupling cancelation to a given observation sample, by multiplying the given observation sample by a coupling matrix containing one or more columns of a coupling matrix that contains a first estimated CCF along a first diagonal and a second estimated CCF along a second different diagonal.

8. The memory controller according to claim 1, wherein the processor is configured to apply cross-coupling cancelation to a given observation sample, by multiplying the given observation sample by a vector given by: $[-\hat{\beta} \ 1-\hat{\alpha}]$, wherein $\hat{\alpha}$ and $\hat{\beta}$ comprise previously estimated CCFs.

9. The memory controller according to claim 1, wherein the processor is configured to apply cross-coupling cancellation to a first observation sample independently from a second observation sample, wherein both the first observation sample and the second observation sample contain first and second target samples produced respectively from first and second target memory cells in the target WL.

10. The memory controller according to claim 1, wherein the processor is configured to use, CCFs estimated based on first observation samples, for cancelling cross-coupling interference in second observation samples different from the first observation samples.

11. The memory controller according to claim 1, wherein the enhanced readout samples correspond to a group of multiple target memory cells in a selected target WL that store a code word encoded using an Error Correction Code (ECC), and wherein the processor is configured to apply the storage operation by calculating one or more soft metrics based on the enhances readout samples, and to decode the ECC of the code word using a soft decoding scheme based on the soft metrics.

12. The memory controller according to claim 1, wherein the processor is configured to read the target memory cells at a first voltage resolution to produce the target samples, and to read the neighbor memory cells at a second voltage resolution to produce the neighbor samples, wherein the first voltage resolution is higher than the second voltage resolution.

13. A method for data storage, comprising:
    in a memory controller that communicates with a plurality of memory cells, wherein an individual one of the plurality of memory cells is configured to store data in one of multiple predefined nominal Programming Voltages (PVs), producing multiple observation samples, wherein an individual observation sample comprises (i) a target sample read from a target memory cell in a target Word Line (WL), and (ii) multiple neighbor samples read from multiple respective neighbor memory cells in multiple neighbor WLs;

based on the observation samples, jointly estimating Cross-Coupling Coefficients (CCFs) that model cross-coupling interference caused to target memory cells in the target WL by the neighbor memory cells in the neighbor WLs, by searching for CCFs that aim to minimize a predefined function of distances calculated between transformed observation samples that have been transformed using the CCFs and respective combinations of nominal PVs that are together closest in distance to the respective transformed observation samples;

based on the estimated CCFs, applying cross-coupling cancelation to one or more readout samples retrieved from the plurality of memory cells to produce respective enhanced readout samples; and performing a storage operation related to reading data from the plurality of memory cells using the enhanced readout samples.

14. The method according to claim 13, wherein the predefined function comprises a sum of the distances squared.

15. The method according to claim 13, wherein jointly estimating the CCFs comprises jointly estimating CCFs $\alpha$ and $\beta$ corresponding to cross-coupling interference caused by neighbor memory cells in respective first and second neighbor WLs adjacent to the target WL.

16. The method according to claim 15, wherein searching for the CCFs comprises calculating a transformed observation sample by multiplying a corresponding observation sample by an inverse matrix of a coupling matrix $\bar{H}$ that contains $\alpha$ along a first diagonal and $\beta$ along a second different diagonal.

17. The method according to claim 15, wherein searching for the CCFs comprises calculating a transformed observation sample by multiplying a corresponding observation sample by a coupling vector $\underline{h}^T$ that is given by $$\underline{h} = [\,-\beta \;\; 1 \;\; -\alpha\,]^T.$$

18. The method according to claim 17, wherein searching for the CCFs comprises identifying a nominal PV among the predefined nominal PVs that is closest in distance to a given transformed observation sample using a slicing operation.

19. The method according to claim 13, wherein applying the cross-coupling cancelation comprises applying the cross-coupling cancelation to a given observation sample, by multiplying the given observation sample by a coupling matrix containing one or more columns of a coupling matrix that contains a first estimated CCF along a first diagonal and a second estimated CCF along a second different diagonal.

20. The method according to claim 13, wherein applying the cross-coupling cancelation comprises applying the cross-coupling cancelation to a given observation sample, by multiplying the given observation sample by a vector given by: $[-\beta \;\; 1-\alpha]$, wherein $\alpha$ and $\beta$ comprise previously estimated CCFs.

21. The method according to claim 13, wherein applying the cross-col/piing cancellation comprises applying cross-coupling cancelation to a first observation sample independently from a second observation sample, wherein both the first observation sample and the second observation sample contain first and second target samples produced respectively from first and second target memory cells in the target WL.

22. The method according to claim 13, wherein applying the cross-coupling cancelation comprises using CCFs estimated based on first observation samples, for cancelling cross-coupling interference in second observation samples different from the first observation samples.

23. The method according to claim 13, wherein the enhanced readout samples correspond to a group of multiple target memory cells in a selected target at that store a code word encoded using an Error Correction Code (ECC), and wherein the processor is configured to apply the storage operation by calculating one or more soft metrics based on the enhances readout samples, and to decode the ECC of the code word using a soft decoding scheme based on the soft metrics.

24. The method according to claim 13, wherein the processor is configured to produce the observation samples by reading the target memory cells at a first voltage resolution to produce the target samples, and reading the neighbor memory cells at a second voltage resolution to produce the neighbor samples, wherein the first voltage resolution is higher than the second voltage resolution.

* * * * *